(12) United States Patent
Kang et al.

(10) Patent No.: US 8,419,853 B2
(45) Date of Patent: Apr. 16, 2013

(54) STACKED SEMICONDUCTOR DEVICE AND RELATED METHOD

(75) Inventors: Yun-Seung Kang, Seoul (KR); Eun-Kuk Chung, Seoul (KR); Joon Kim, Seoul (KR); Jin-Hong Kim, Suwon-si (KR); Suk-Chul Bang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 814 days.

(21) Appl. No.: 12/623,515

(22) Filed: Nov. 23, 2009

(65) Prior Publication Data

US 2010/0065912 A1  Mar. 18, 2010

Related U.S. Application Data

(62) Division of application No. 11/485,323, filed on Jul. 13, 2006, now Pat. No. 7,682,450.

(30) Foreign Application Priority Data

Jul. 15, 2005  (KR) .................................. 2005-63997

(51) Int. Cl.
    *C30B 21/04*  (2006.01)
(52) U.S. Cl.
    USPC .................... 117/86; 117/90; 117/95; 117/99; 257/211; 257/751; 257/758

(58) Field of Classification Search ..................... 117/86, 117/90, 95, 99; 257/751, 211, 758
See application file for complete search history.

(56) References Cited

U.S. PATENT DOCUMENTS

| 5,731,217 | A | 3/1998 | Kadosh et al. |
| 5,818,069 | A | 10/1998 | Kadosh et al. |
| 2004/0207085 | A1* | 10/2004 | Fujii et al. ..................... 257/751 |
| 2005/0274691 | A1* | 12/2005 | Park ................................. 216/41 |
| 2006/0048702 | A1 | 3/2006 | Son et al. |
| 2006/0108627 | A1 | 5/2006 | Choi et al. |

FOREIGN PATENT DOCUMENTS

KR  200296743  12/2002

\* cited by examiner

*Primary Examiner* — Bob M Kunemund
(74) *Attorney, Agent, or Firm* — Volentine & Whitt, PLLC

(57) ABSTRACT

A stacked semiconductor device and a method for fabricating the stacked semiconductor device are disclosed. The stacked semiconductor device includes a first insulating interlayer having an opening that partially exposes a substrate, wherein the substrate includes single crystalline silicon, and a first seed pattern that fills the opening, wherein the first seed pattern has an upper portion disposed over the opening, and the upper portion is tapered away from the substrate. The stacked semiconductor device further includes a second insulating interlayer formed on the first insulating interlayer, wherein a trench that exposes the upper portion of the first seed pattern penetrates the second insulating interlayer, and a first single crystalline silicon structure that fills the trench.

12 Claims, 9 Drawing Sheets

STACKED SEMICONDUCTOR DEVICE AND RELATED METHOD

CROSS-REFERENCE TO RELATED APPLICATION

This is a divisional of application Ser. No. 11/485,323 filed on Jul. 13, 2006 now U.S. Pat. No. 7,682,450, which is incorporated herein by reference in its entirety.

BACKGROUND OF THE INVENTION

1. Field of the Invention

Embodiments of the invention relate to a stacked semiconductor device and a method for fabricating the stacked semiconductor device. In particular, embodiments of the invention relate to a stacked semiconductor device including a single crystalline silicon structure and a method of fabricating the stacked semiconductor device.

This application claims priority to Korean Patent Application No. 2005-63997, filed on Jul. 15, 2005, the subject matter of which is hereby incorporated by reference in its entirety.

2. Description of Related Art

As the design rules for semiconductor devices decrease, the sizes of unit cells, conductive patterns, and intervals between the conductive patterns in semiconductor devices decrease accordingly. However, as the sizes of the conductive patterns and intervals become smaller, the electrical resistances of the conductive patterns may increase greatly. Additionally, the relatively small patterns are not readily formed through conventional semiconductor fabrication techniques, so it may not be possible to form patterns having the desired dimensions.

Thus, a method for fabricating a stacked semiconductor device has been developed in order to avoid the difficulties described above, which are caused by using conventional methods for fabricating semiconductor devices. In the stacked semiconductor device, unit elements such as metal oxide semiconductor (MOS) transistors are vertically stacked on a substrate. To manufacture the stacked semiconductor device, a thin film serving as a channel layer is formed on or over the substrate. The thin film generally has a crystalline structure that is substantially the same as the crystalline structure of a bulk silicon substrate. Thus, a single crystalline silicon layer is usually used as the channel layer in the stacked semiconductor device. The single crystalline silicon layer may be formed by thermally treating an amorphous silicon layer after the amorphous silicon layer has been formed on a seed layer containing single crystalline silicon. Alternatively, the single crystalline silicon layer may be formed through a damascene process. In the damascene process, after forming a trench exposing a seed, the single crystalline silicon layer may be formed in the trench through a selective epitaxial growth (SEG) process. When the single crystalline silicon layer is formed through the damascene process, the single crystalline silicon layer may have crystalline structure that is substantially superior to that of the single crystalline silicon layer formed through the thermal treatment process.

Figure (FIG.) 1 is a cross-sectional view illustrating a single crystalline silicon layer formed through a conventional damascene process. The single crystalline silicon layer may be used in a conventional stacked semiconductor device.

Referring to FIG. 1, a damaged portion 24 of a seed pattern 16 is generated while forming a trench 20 in order to form a single crystalline silicon layer 22 because an upper portion of the seed pattern 16 is exposed through the trench 20. When the seed pattern 16 includes the damaged portion 24, the single crystalline silicon layer 22 has a poor crystalline structure because the single crystalline silicon layer 22 is formed by an epitaxial process using the seed pattern 16.

A first insulating interlayer 12 and a second insulating interlayer 18 are somewhat excessively etched to form the trench 20 exposing the upper portion of the seed pattern 16 so that a bottom of the trench 20 is higher than a surface of the seed pattern 16, relative to a surface of the substrate 10. In the conventional stacked semiconductor device of FIG. 1, an etching gas for forming the trench 20 may not permeate into an interface between the insulating interlayer 12 and the seed pattern 16 because an upper portion of the seed pattern 16 is tapered away from the substrate 10. As a result, a silicon fence 26 is formed at the upper portion of the seed pattern 16.

Because the single crystalline silicon layer 22 does not grow properly from the silicon fence 26, a portion of the single crystalline silicon layer 22 formed on the silicon fence 26 may be thinner than other portions of the single crystalline silicon layer 22. When the single crystalline silicon layer 22 is used as a channel layer of the stacked semiconductor device, charge carriers may be less mobile at the portion of the single crystalline silicon layer 22 formed on the silicon fence 26 than at other portions. Thus, a response speed of a unit element formed on the single crystalline silicon layer 22 in the stacked semiconductor device may be reduced.

When a contact plug is formed through the portion of the single crystalline silicon layer 22 formed on the silicon fence 26, a contact area between the contact plug and the single crystalline silicon layer 22 may be relatively small and thereby increase a contact resistance of the stacked semiconductor device.

The single crystalline silicon layer 22 may not be properly grown from the silicon fence 26 of the seed pattern 16. Thus, the single crystalline silicon layer 22 may have an undesired crystalline structure and voids 28, which may occur in a central portion of the single crystalline silicon layer 22.

Therefore, a stacked semiconductor device including a single crystalline structure having a desirable crystalline structure without voids or crystalline defects is needed.

SUMMARY OF THE INVENTION

Embodiments of the invention provide a stacked semiconductor device including a single crystalline silicon structure suitable for a channel layer. Embodiments of the invention also provide a method of fabricating a stacked semiconductor device including a single crystalline silicon structure suitable for a channel layer.

In accordance with embodiments of the invention, a first seed pattern filling an opening may have an upper portion that is tapered away from the substrate to prevent an oxide fence from being generated on a sidewall of the first seed pattern. Additionally, the first single crystalline silicon structure may have a good crystalline structure without voids therein because the first single crystalline silicon structure is formed using the first seed pattern as a seed. Also, a damaged portion of a preliminary first seed pattern may be removed while forming the first seed pattern. As a result, the first single crystalline silicon structure may have an improved crystalline structure by considerably reducing the number of crystalline defects and voids generated in the first single crystalline silicon structure.

In one embodiment, the invention provides a stacked semiconductor device including a first insulating interlayer having an opening that partially exposes a substrate, wherein the substrate includes single crystalline silicon; and a first seed pattern that fills the opening, wherein the first seed pattern includes an upper portion disposed over the opening, and the upper portion is tapered away from the substrate. The stacked semiconductor device further includes a second insulating interlayer formed on the first insulating interlayer, wherein a trench that exposes the upper portion of the first seed pattern penetrates the second insulating interlayer; and a first single crystalline silicon structure that fills the trench.

In another embodiment, the invention provides a method of fabricating a stacked semiconductor device including forming a preliminary first insulating interlayer on a substrate having single crystalline silicon, wherein the preliminary first insulating interlayer has a first opening exposing a first portion of the substrate; forming a first preliminary first seed pattern in the first opening; and forming a preliminary second insulating interlayer on the first preliminary first seed pattern and the preliminary first insulating interlayer. The method further comprises partially etching the preliminary first insulating interlayer and the preliminary second insulating interlayer to form a trench exposing a first upper portion of the first preliminary first seed pattern; forming a first seed pattern in the first opening by partially etching the first upper portion of the first preliminary first seed pattern, wherein the first seed pattern has a second upper portion disposed over the first opening, and the second upper portion is tapered away from the substrate; and forming a first single crystalline silicon structure in the trench using the first seed pattern as a seed.

BRIEF DESCRIPTION OF THE DRAWINGS

Embodiments of the invention will be described herein with reference to the accompanying drawings, in which like reference symbols refer to like elements throughout. For clarity, layers and regions in the drawings may not be drawn to scale. In the drawings.

DESCRIPTION OF EMBODIMENTS

Figure 1:
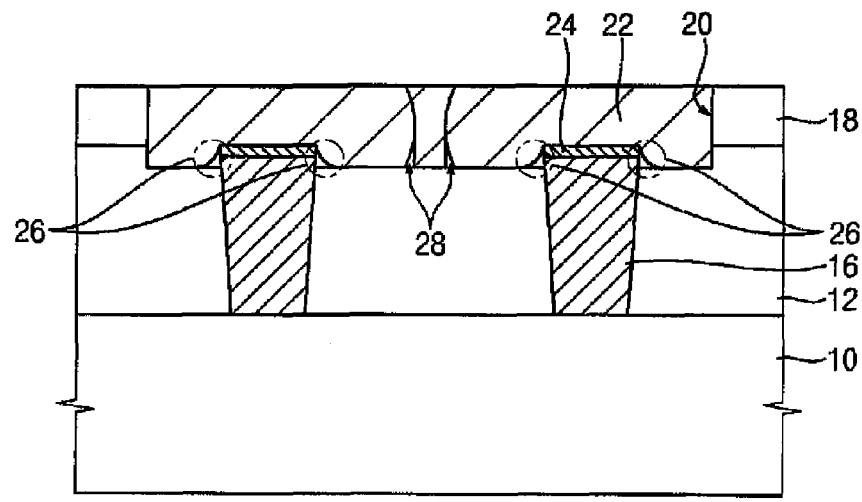
FIG. 1 is a cross-sectional view illustrating a conventional single crystalline silicon layer in a semiconductor device formed through a damascene process.

It will be understood that when an element or layer is referred to as being "on," "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, no intervening elements or layers are present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections are not limited by these terms. These terms are used only to distinguish one element, component, region, layer, or section from another element, component, region, layer, or section. Thus, a first element, component, region, layer, or section discussed below could be referred to as a second element, component, region, layer, or section without departing from the scope of the invention as defined by the accompanying claims.

Spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. For example, if a device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Those of ordinary skill in the art will understand that, in actual implementation, the shape of an element may not be exactly as shown in the drawings. Thus, embodiments of the present invention should not be construed as limited to the particular shapes of regions illustrated herein but are to include deviations in shapes that result, for example, from manufacturing.

Figure 2:
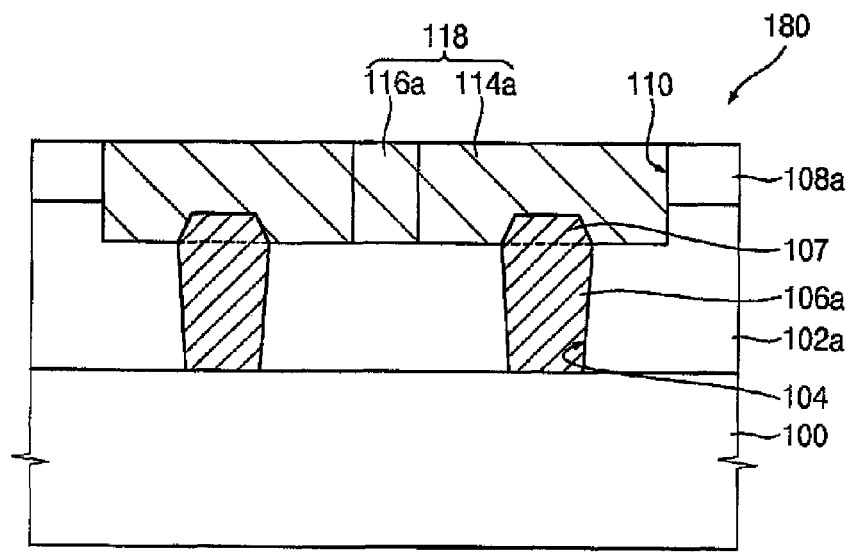
FIG. 2 is a cross-sectional view illustrating a stacked semiconductor device in accordance with an embodiment of the invention.

FIG. 2 is a cross-sectional view illustrating a stacked semiconductor device in accordance with an embodiment of the invention. The stacked semiconductor device comprises a single crystalline silicon structure 118.

For convenience of description, throughout the description only one of each type of element illustrated in a drawing will generally be described, though the drawing may show a plurality of that element.

Referring to FIG. 2, a stacked semiconductor device 180 is formed on a substrate 100 having an upper portion formed of single crystalline silicon. The substrate 100 may include a bulk silicon substrate or a silicon-on-insulator (SOI) substrate.

In some embodiments of the invention, one or more first unit elements such as first transistors may be formed on the substrate 100.

A first insulating interlayer 102a is formed on the substrate 100. When a unit element is formed on the substrate 100, the first insulating interlayer 102a may sufficiently cover the unit element. The first insulating interlayer 102a has an opening 104 that partially exposes the substrate 100. The opening 104 has an upper portion and a lower portion wherein the upper portion is substantially wider than the lower portion (i.e., the opening 104 is tapered in the direction pointing from the top of the opening 104 to the substrate 100). The first insulating interlayer 102a also comprises a recessed portion under which the opening 104 is disposed. That is, the first insulation interlayer 102a has a stepped portion disposed on the opening 104. An upper active region is formed on the recessed portion of the first insulating interlayer 102a. The upper active region is disposed over a lower active region formed on the substrate 100. In some embodiments of the invention, the upper active region may serve as a tunnel layer of a transistor.

A seed pattern 106a is formed on the substrate 100 and fills the opening 104. An upper portion 107 of the seed pattern 106a protrudes from the opening 104. The upper portion 107 is tapered away from the substrate 100. That is, the width of an upper portion of the upper portion 107 may be substantially smaller than the width of a lower portion of the upper portion 107. As used herein, when a first element is said to be "tapered away from" a second element, it means that at least a portion of the shape of the first element is tapered in a direction that is perpendicular to and oriented away from the second element. A lower portion of the seed pattern 106a may have substantially the same shape as the opening 104 because the lower portion of the seed pattern 106a fills the opening 104. That is, the lower portion of the seed pattern 106a is tapered in the direction pointing from the top of the opening 104 to the substrate 100. Thus, the width of an upper portion of the lower portion of the seed pattern 106a may be substantially larger than the width of a lower portion of the lower portion of the seed pattern 106a.

In some embodiments of the invention, the seed pattern 106a may include silicon formed through a selective epitaxial growth (SEG) process, and when the seed pattern 106a includes silicon formed through a selective epitaxial growth (SEG) process, a damaged upper portion of the seed pattern 106a may be removed.

A second insulating interlayer 108a is formed on the first insulating interlayer 102a. A trench 110 that exposes the seed pattern 106a penetrates the second insulating interlayer 108a. The trench 110 is formed in the second insulating interlayer 108a and the first insulating interlayer 102a. The trench 110 includes the recessed portion of the first insulating interlayer 102a. Because the trench 110 includes the recessed portion of the first insulating interlayer 102a, the seed pattern 106a is exposed through the trench 110. Particularly, the upper portion 107 of the seed pattern 106a is exposed through the trench 110. The trench 110 may serve as a mold pattern for forming the upper active region disposed over the substrate 100. In one embodiment of the invention, the portion of the trench 110 formed in the second insulating interlayer 108a and the portion of the trench 110 formed in the first insulating interlayer 102a (i.e., the recessed portion of the first insulating interlayer 102a) may be formed simultaneously.

The single crystalline silicon structure 118 is formed on the seed pattern 106a and the first insulating interlayer 102a. The single crystalline silicon structure 118 serves as the upper active region of the stacked semiconductor device 180. The single crystalline silicon structure 118 includes a first single crystalline silicon pattern 114a and a second single crystalline silicon pattern 116a. The first single crystalline silicon pattern 114a covers the seed pattern 106a and the second single crystalline silicon pattern 116a makes contact with the first single crystalline silicon pattern 114a. The first single crystalline silicon pattern 114a may be formed through an SEG process using the seed pattern 106a as a seed. The second single crystalline silicon pattern 116a may be formed through a phase transition process based on the first single crystalline silicon 114a. That is, a portion of the first single crystalline silicon pattern 114a may be changed into the second single crystalline silicon 116a. An upper surface of the single crystalline silicon structure 118 and an upper surface of the second insulating layer 108a may be disposed in the same plane.

In one embodiment of the invention, the first single crystalline silicon pattern 114a is formed on the seed pattern 106a to partially fill trench 110, and then the second single crystalline silicon pattern 116a is formed adjacent to the first single crystalline silicon 114a to completely fill the trench 110. The second single crystalline silicon pattern 116a may be separated from the seed pattern 106a.

In some embodiments of the invention, one or more second unit elements such as second transistors may be formed on the single crystalline silicon structure 118.

As described above, the stacked semiconductor device 180 includes the seed pattern 106a having an upper portion 107 that is tapered away from the substrate 100. Hence, the single crystalline silicon structure 118 having a desired shape may be advantageously formed on the seed pattern 106a without generating voids or seams therein because the single crystalline silicon structure 118 is formed through an SEG process using the seed pattern 106a as a seed. When the single crystalline silicon structure 118 is used as the channel layer of for a second unit element, the second unit element may have improved electrical characteristics.

When the damaged upper portion of the seed pattern 106a is removed, the single crystalline silicon structure 118 may be more advantageously used as a channel layer because the single crystalline silicon 118 formed using the seed pattern 106a may be substantially free from crystalline defects.

FIGS. 3 through 10 are cross-sectional views illustrating a method of fabricating stacked semiconductor device 180 in accordance with an embodiment of the invention.

Figure 3:
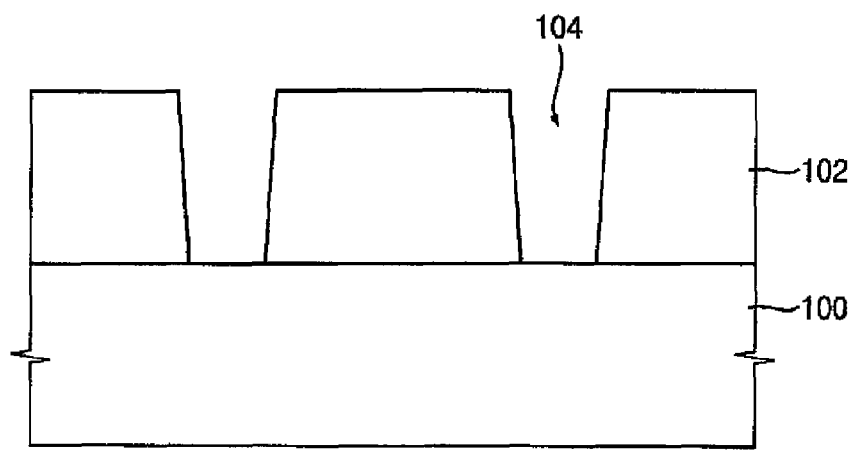
FIGS. 3 through 10 are cross-sectional views illustrating a method for fabricating the stacked semiconductor device of FIG. 2 in accordance with an embodiment of the invention.

Referring to FIG. 3, a substrate 100 having an upper portion formed of single crystalline silicon is provided. The substrate 100 may include a bulk silicon substrate or an SOI substrate. One or more first unit elements, e.g., one or more first transistors, may be formed on the substrate 100. The substrate 100 also includes a lower active region (not shown).

A preliminary first insulating interlayer 102 is formed on the substrate 100. The preliminary first insulating interlayer 102 may be formed using oxide through a chemical vapor deposition (CVD) process.

An opening 104 is formed through the preliminary first insulating interlayer 102 to expose a portion of the substrate 100. The opening 104 may be formed through a photolithography process.

Figure 4:
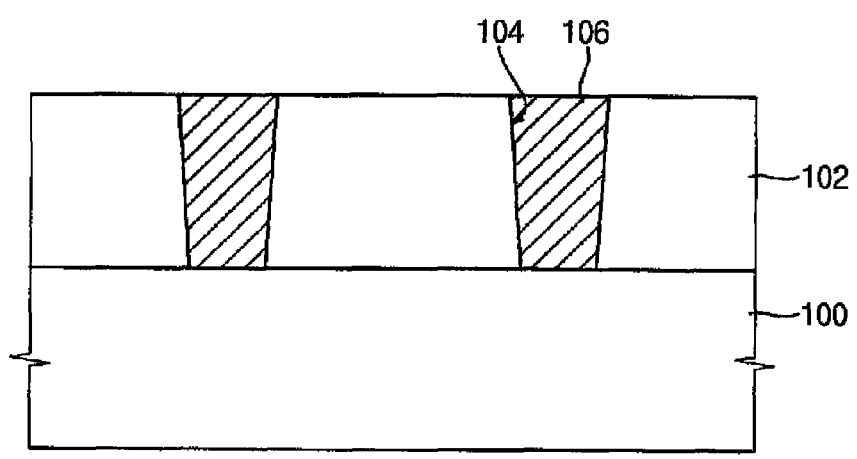

Referring to FIG. 4, a preliminary seed pattern 106 is formed to fill the opening 104. That is, a seed layer of single crystalline silicon, from which the preliminary seed pattern 106 is formed, is formed from the exposed portion of the substrate 100 to fill the opening 104. The seed layer may be formed through an SEG process using the exposed portion of the substrate 100 as a seed. The seed layer may completely fill the opening 104. That is, the height of the seed layer relative to an upper surface of the substrate 100 and the height of the preliminary first insulating layer 102 relative to the upper surface of the substrate 100 may be substantially the same.

The processes for forming the seed layer will be described in more detail hereinafter.

A cleaning process may be performed on the substrate 100 to remove a native oxide layer formed on the exposed portion of the substrate 100. Then, the SEG process may be performed to form the seed layer of single crystalline silicon on the exposed portion of the substrate 100. When the SEG process is performed at a temperature below about 750° C., single crystalline silicon may not properly grow from the exposed portion of the substrate 100. When the SEG process is performed at a temperature above about 1,250° C., the growth of single crystalline silicon from the substrate 100 may not be readily controlled. Therefore, the SEG process for forming the seed layer may be performed at a temperature in a range of about 750° C. to about 1,250° C. In one embodiment of the invention, the seed layer may be formed at a temperature of about 800° C. to about 900° C.

In the SEG process for forming the seed layer, a reaction gas used to grow single crystalline may include a silicon source gas. The silicon source gas may include, for example, at least one of the following: silicontetrachloride ($SiCl_4$), silane ($SiH_4$), dichlorosilane ($SiH_2Cl_2$), trichlorosilane ($SiHCl_3$), etc. In one embodiment of the invention, the reaction gas may include silicontetrachloride.

In an embodiment of the invention, a capping layer (not shown) may be formed on the seed layer and the preliminary first insulating interlayer 102. The capping layer may protect the seed layer during subsequent processes. However, in order to simplify the manufacturing processes for the stacked semiconductor device, the capping layer may not be formed on the seed layer and the preliminary first insulating interlayer 102.

A chemical mechanical polishing (CMP) process may be performed on the capping layer and the seed layer until the preliminary first insulating interlayer 102 is exposed. Thus, a preliminary seed pattern 106 is formed in the opening 104. In the embodiment illustrated in FIG. 4, the preliminary seed pattern 106 completely fills opening 104. The preliminary seed pattern 106 includes single crystalline silicon.

Figure 5:
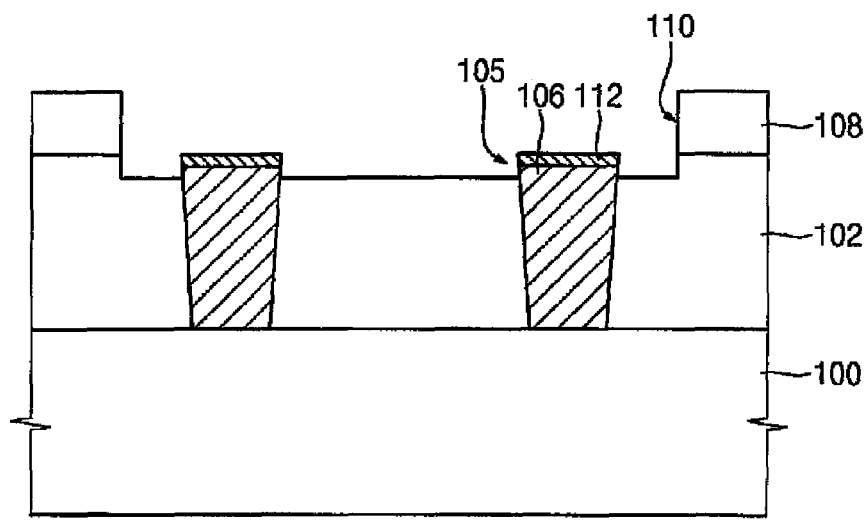

Referring to FIGS. 4 and 5, a preliminary second insulating interlayer 108 is formed on the preliminary seed pattern 106 and the preliminary first insulating interlayer 102. The preliminary second insulating interlayer 108 may be formed using oxide through a CVD process.

A photoresist pattern (not shown) is formed on the preliminary second insulating interlayer 108. The photoresist pattern exposes a portion of the preliminary second insulating interlayer 108 disposed over the preliminary seed pattern 106. The exposed portion of the preliminary second insulating interlayer 108 may have a width that is greater than the width of the preliminary seed pattern 106.

Using the photoresist pattern as an etching mask, the preliminary second insulating interlayer 108 and the preliminary first insulating interlayer 102 are partially etched to form a trench 110 that exposes the preliminary seed pattern 106. The width of the trench 110 may be greater than the width of the preliminary seed layer 106. Thus, a portion of the preliminary first insulating interlayer 102 is exposed after the trench 110 is formed. Additionally, the preliminary seed pattern 106 partially protrudes from a bottom of the trench 110 formed in the preliminary second insulating interlayer 108 and the preliminary first insulating interlayer 102.

In one embodiment of the invention, two preliminary seed patterns 106 may be exposed through the trench 110.

In some embodiments of the invention, the preliminary first insulating interlayer 102 may be partially etched such that the preliminary seed pattern 106 protrudes from the bottom of the trench 110. The trench 110 may serve as a mold pattern for forming a single crystalline silicon structure 118 (see FIG. 10).

In one embodiment of the invention, the trench 110 may be formed through a dry etching process. For example, the trench 110 may be formed through a reactive ion etching (RIE) process. Hence, a surface 112 of the preliminary seed pattern 106 may be damaged during the dry etching process because the surface 112 is exposed during the dry etching process (i.e., defects may be generated on the surface 112).

Figure 6:
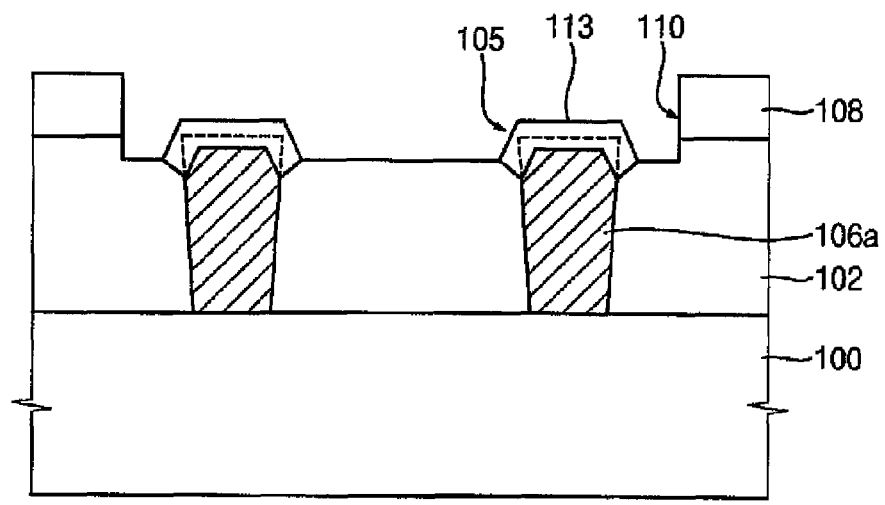

Referring to FIG. 6, an oxide layer 113 is formed on an upper portion 105 of the preliminary seed pattern 106 through oxidizing the surface 112 of the preliminary seed pattern 106. Oxide layer 113 may be formed through a thermal oxidation process.

The oxide layer 113 may be formed on the upper portion 105 of the preliminary seed pattern 106 to enclose the surface 112 of preliminary seed pattern 106. In particular, the oxide layer 113 may be formed on the preliminary seed layer 106 and a portion of the preliminary first insulating layer 102 surrounding the preliminary seed pattern 106. Additionally, the oxide layer 113 may be formed in a portion of the preliminary first insulating layer 102 surrounding the upper portion 105 of the preliminary seed pattern 106.

While forming the oxide layer 113, the preliminary seed pattern 106 is changed into a seed pattern 106a having an upper portion 107 (see FIG. 7), which is tapered away from the substrate 100. That is, the seed layer 106a has the upper portion 107, wherein the width of an upper portion of the upper portion 107 may be substantially smaller than the width of a lower portion of the upper portion 107.

When the oxide layer 113 is formed through a thermal oxidation process, the defects in the surface 112 of the preliminary seed layer 106 may be completely cured by adjusting the thickness of the oxide layer 113. In particular, the defects (i.e., etched damage) caused to the surface 112 of the preliminary seed pattern 106 by an etching process may be completely cured after forming the oxide layer 113 because the defects created in the surface 112 may be changed into the oxide layer 113. As a result, the seed pattern 106a may have substantially no defects caused by etching. Because the oxide layer 113 is formed through a thermal oxidation process, a selected portion of the oxide layer 113 may be substantially thicker than other portions of the oxide layer 113. Thus, upper portion 107 of the seed pattern 106a is tapered away from the substrate 100.

Figure 7:
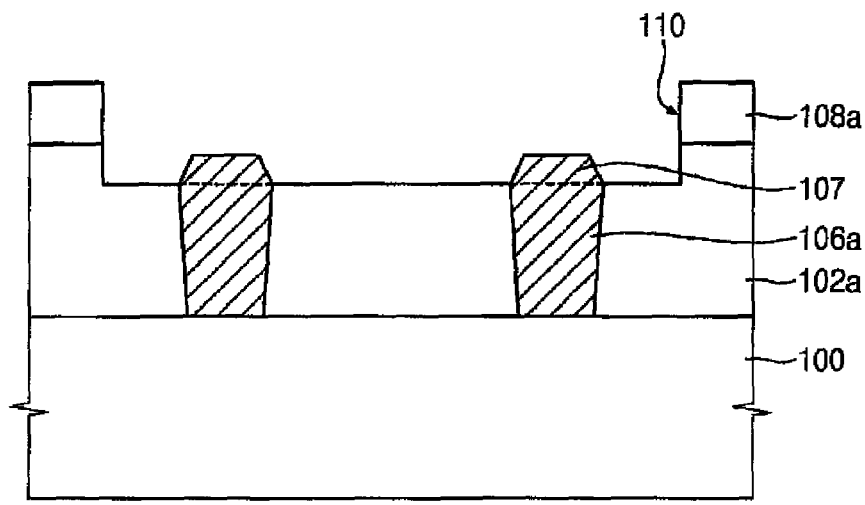

Referring to FIG. 7, the oxide layer 113 is removed from the seed pattern 106a. When the oxide layer 113 is removed, the preliminary second insulating interlayer 108 and the preliminary first insulating interlayer 102 are partially removed because the preliminary second insulating interlayer 108 and the preliminary first insulating interlayer 102 are formed using oxides. Therefore, when the oxide layer 113 is removed, the preliminary second insulating interlayer 108 and the preliminary first insulating interlayer 102 are changed into a first insulating interlayer 102a and a second insulating interlayer 108a, respectively.

In one embodiment of the invention, the oxide layer 113 may be removed through a wet etching process. For example, the oxide layer 113 may be etched using an etching solution that includes a diluted hydrogen fluoride (HF) acid solution.

In one embodiment of the invention, after forming the seed pattern 106a, etched residues or particles may be removed from the seed pattern 106a using an additional etching solution. The additional etching solution may include ammonium hydroxide ($NH_4OH$), hydrogen peroxide ($H_2O_2$), and water.

When the oxide layer 113 is removed from the seed pattern 106a, the upper portion 107 of the seed pattern 106a protrudes from the bottom of the trench 110, which is an upper face of the etched portion of the first insulating interlayer 102a. The upper portion 107 of the seed pattern 106a may be tapered away from the substrate 100. That is, the width of an upper portion of the upper portion 107 of the seed pattern 106a may be substantially smaller than the width of a lower portion of the upper portion 107 of the seed pattern 106a.

Since the preliminary first insulating interlayer 102 and the preliminary second insulating interlayer 108 are slightly etched while removing the oxide layer 113, the bottom of the trench 110 may be brought slightly closer to the substrate 100 (i.e., slightly lowered towards the substrate 100) while removing the oxide layer 113. That is, the trench 110 may have a greater depth after removing the oxide layer 113. In addition, the width of the trench 110 may be slightly enlarged through the removal of the oxide layer 113 because the preliminary first insulating interlayer 102 and the preliminary second insulating interlayer 108 are partially removed when the oxide layer 113 is removed, as described previously.

After removing the oxide layer 113, the height of the seed pattern 106a may be substantially less than was the height of the preliminary seed pattern 106. Thus, the difference between the depth of the trench 110 and the height of the seed pattern 106a may increase. As a result, the single crystalline silicon structure 118, which may serve as a channel layer, may have an increased thickness when the single crystalline silicon structure 118 is formed using the trench 110 as a mold pattern.

Figure 8:
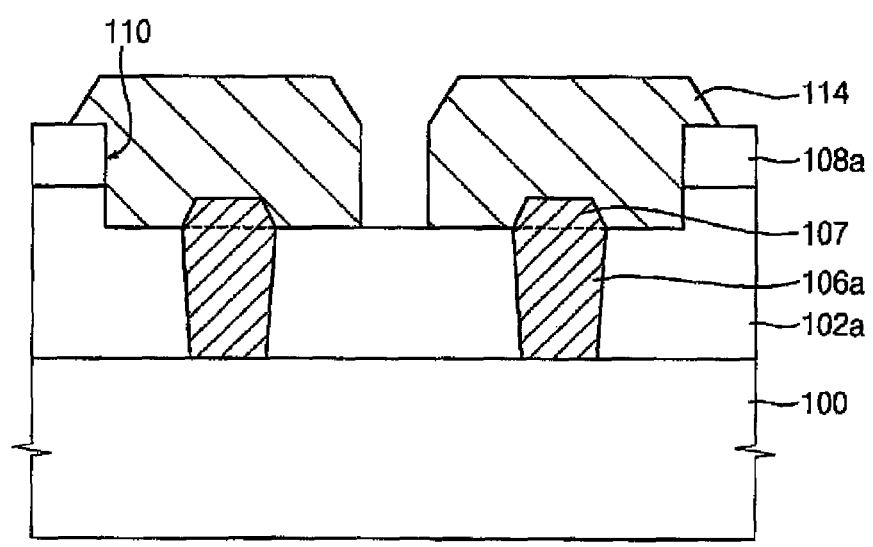

Referring to FIG. 8, a first single crystalline silicon layer 114 is formed on the seed pattern 106a and the second insulating interlayer 108a using the seed pattern 106a as a seed. The first single crystalline silicon layer 114 may be formed through an SEG process, and the first single crystalline silicon layer 114 partially fills the trench 110. That is, a portion of the first insulating interlayer 102a adjacent to the seed pattern 106a is exposed after forming the first single crystalline silicon layer 114. When two seed patterns 106a are formed on the substrate 100, a portion of the first insulating interlayer 102a between the two seed patterns 106a may be exposed since the trench 110 is partially filled with the first single crystalline silicon layer 114.

In some embodiments of the invention, the first single crystalline silicon layer 114 may be formed through a first SEG process that is substantially the same as an SEG through which the preliminary seed pattern 106 may be formed.

When the first single crystalline silicon layer 114 is formed through the first SEG process, single crystalline silicon may grow along a sidewall profile of the upper portion 107 of the seed pattern 106a. Since the upper portion 107 may be tapered away from the substrate 100, and a silicon oxide fence may not be formed on the seed pattern 106a, the first single crystalline silicon layer 114 may also be tapered away from the substrate 100. In particular, an upper portion of the first single crystalline silicon layer 114 may be tapered away from the substrate 100.

Figure 9:
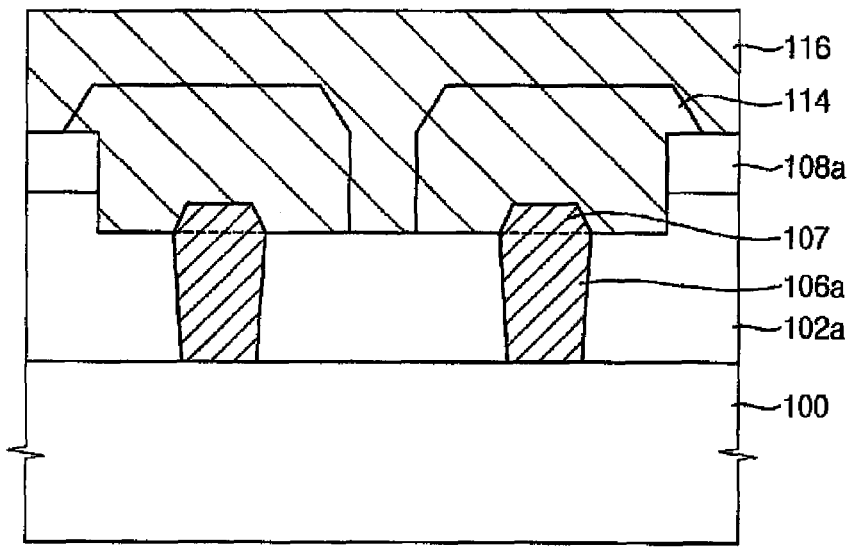

Referring to FIG. 9, an amorphous silicon layer is formed on the second insulating interlayer 108a and on the portion of the first insulating interlayer 102a adjacent to the first single crystalline silicon layer 114. Additionally, the amorphous silicon layer covers the first single crystalline silicon layer 114. Thus, the amorphous silicon layer has a height relative to the substrate 100 that is greater than the height of the first single crystalline silicon layer 114 relative to the substrate 100. When the amorphous silicon layer is formed, the trench 110 is completely filled by the amorphous silicon layer and the first single crystalline silicon layer 114. In one embodiment of the invention, the amorphous silicon layer may cover two first single crystalline silicon layers 114, and also may fill a gap between the two first single crystalline silicon layers 114. The amorphous silicon layer may be formed in the trench 110 through a CVD process.

The amorphous silicon layer is changed into a second single crystalline silicon layer 116 through a phase transition process. Since the second single crystalline silicon layer 116 is formed using the first single crystalline silicon layer 114, the second single crystalline silicon layer 116 may have a crystalline structure that is substantially the same as the crystalline structure of the first single crystalline silicon layer 114. The second single crystalline silicon layer 116 is formed on the second insulating interlayer 108a and covers the first single crystalline silicon layer 114. Additionally, the second single crystalline silicon layer 116 may fill a gap between two first single crystalline silicon layers 114 in an embodiment in which two first single crystalline silicon layers 114 are formed. The two first single crystalline silicon layers 114 may each be tapered away from the substrate 100, so the second single crystalline silicon layer 116 may readily fill the trench 110 without generating a void or a seam.

In one embodiment of the invention, the amorphous silicon layer may be changed into the second single crystalline silicon layer 116 through a heat treatment process. When the amorphous silicon layer is thermally treated at a temperature below about 570° C., the amorphous silicon layer may not be properly changed into the second single crystalline layer 116. When the second single crystalline layer 116 is formed at a temperature above about 650° C., the second single crystalline layer 116 may not have the desired structure and characteristics. Therefore, the heat treatment process for forming the second single crystalline layer 116 may be performed at a temperature in a range of about 570° C. to about 650° C. For example, the second single crystalline layer 116 may be formed at a temperature of about 590° C. to about 620° C. Additionally, the heat treatment process may be performed for about 8 hours to about 15 hours.

In another embodiment of the invention, the second single crystalline silicon layer 116 may be formed by irradiating a laser onto the amorphous silicon layer.

Figure 10:
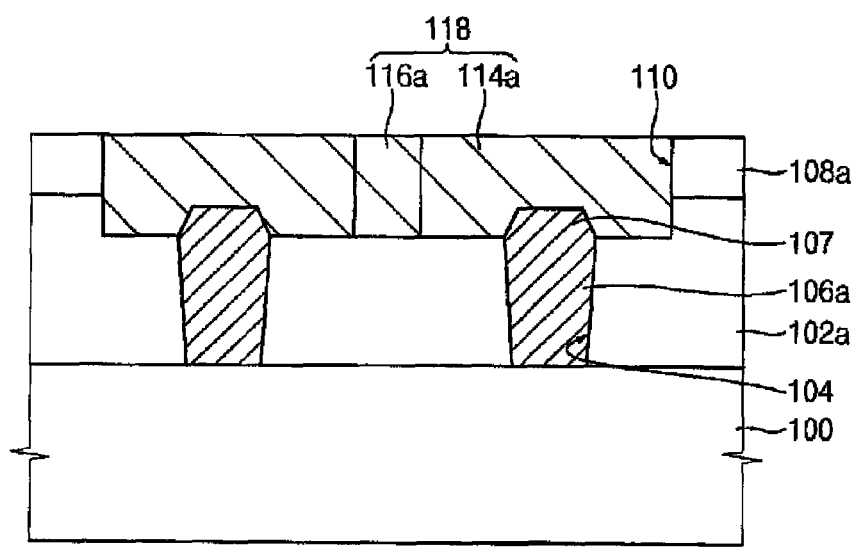

Referring to FIGS. 9 and 10, the first and the second single crystalline silicon layers 114 and 116 are partially removed until the second insulating interlayer 108a is exposed. By partially removing the second single crystalline silicon layer 116 and the first single crystalline silicon layer 114, a first single crystalline silicon layer pattern 114a and a second single crystalline silicon layer pattern 116a are formed in the trench 110. Thus, the single crystalline silicon structure 118, which includes the first single crystalline silicon pattern 114a and the second single crystalline silicon pattern 116a, is formed in the trench 110. The first and second single crystalline silicon layers 114 and 116 may be partially removed through a CMP process. The first single crystalline silicon pattern 114a is formed on the first insulating interlayer 102a to cover the seed pattern 106a, and the second single crystalline silicon pattern 116a is formed on the first insulating interlayer 102a and to make contact with the first single crystalline silicon pattern 114a. As described above, first single crystalline silicon pattern 114a may be formed through an SEG process and the second single crystalline silicon pattern 116a may be formed through a phase transition process.

A first portion of the single crystalline silicon structure 118 that is formed on (i.e., contacts) the upper portion of the seed pattern 106a may not properly serve as the channel layer because a crystalline structure of the first portion of the single crystalline silicon structure 118 may be broken. Thus, portions of the single crystalline silicon structure 118 other than the first portion of the single crystalline silicon structure 118, which makes contact with the upper portion of the seed pattern 106a, may be advantageously used as the channel layer. In the embodiment illustrated in FIG. 10, the channel layer (i.e., the single crystalline silicon structure 118) may be thicker than a channel layer formed in a conventional semiconductor device since the upper portion of the seed pattern 106a is substantially lower than that of a conventional seed pattern. When the channel layer has an increased thickness, as described previously, unit elements of the stacked semiconductor device 180 (see FIG. 2) formed on the single crystalline silicon structure 118 may have improved electrical characteristics.

In one embodiment of the invention, a contact plug may be formed through the single crystalline silicon structure 118. Since the contact plug may be advantageously formed through the single crystalline silicon structure 118 having the increased thickness described above, the contact plug may have a reduced contact resistance.

In some embodiments of the invention, the number of crystalline defects and voids in single crystalline silicon structure 118 may be considerably reduced relative to a conventional stacked semiconductor device, hence the single crystalline structure 118 may have an increased thickness. When the single crystalline silicon layer 118 is used as a channel layer of the stacked semiconductor device 180, the stacked semiconductor device 180 may have improved electrical characteristics.

Figure 11:
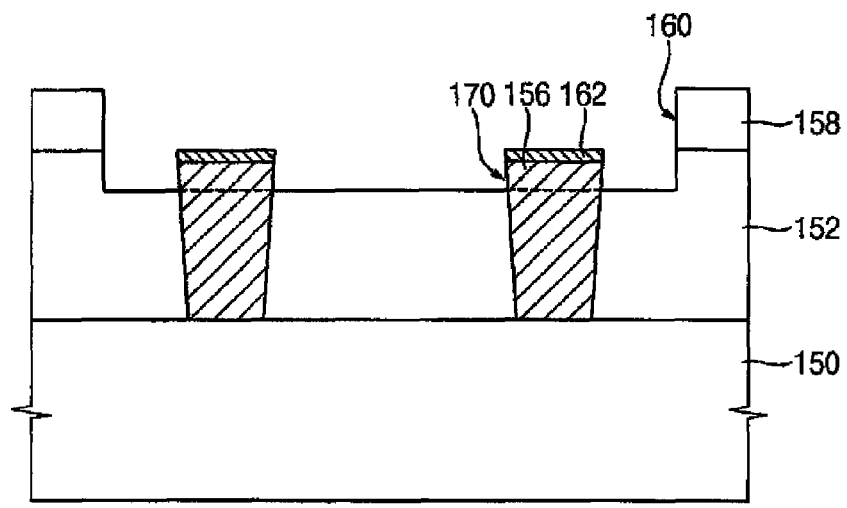
FIGS. 11 and 12 are cross-sectional views illustrating a method for fabricating a stacked semiconductor device in accordance with another embodiment of the invention.
Figure 12:
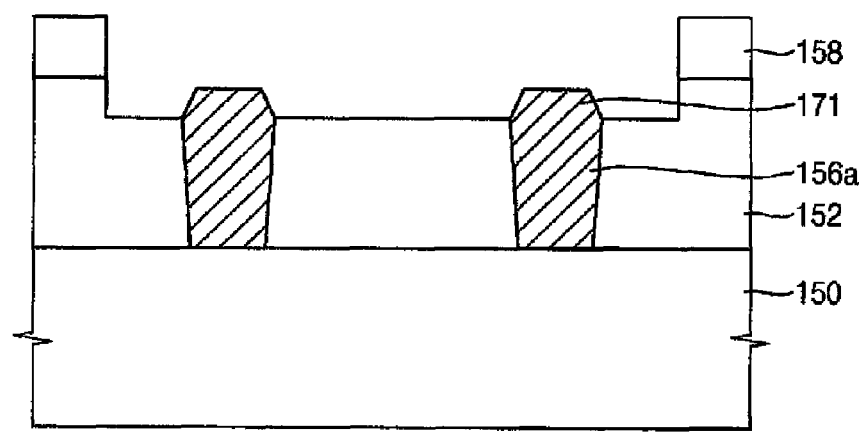

FIGS. 11 and 12 are cross-sectional views illustrating a method for fabricating a stacked semiconductor device in accordance with another embodiment of the invention. Except for a seed pattern 156*a*, the stacked semiconductor device shown in FIGS. 11 and 12 may be manufactured through processes that are substantially the same as those described with reference to FIGS. 3 through 5.

Referring to FIG. 11, after a first insulating interlayer 152 is formed on a substrate 150, a preliminary seed pattern 156 is formed to penetrate through the first insulating interlayer 152. A second insulating interlayer 158 is formed on the first insulating interlayer 152, and then a trench 160 is formed by partially etching the first insulating interlayer 152 and second insulating interlayer 158. An upper portion 170 of the preliminary seed pattern 156 is exposed after forming the trench 160. That is, the upper portion 170 of the preliminary seed pattern 156 protrudes from a bottom of the trench 160. In addition, the height, relative to the substrate 150, of a top of the upper portion 170 of the preliminary seed pattern 156, which protrudes from the bottom of the trench 160, may be substantially greater than the height of the preliminary seed pattern 106, described with reference to FIG. 5, relative to the substrate 100.

In an etching process for forming trench 160, defects may be generated on a surface 162 of the preliminary seed pattern 156 because surface 152 of the preliminary seed pattern 156 is exposed during the etching process (i.e., the surface 162 may be damaged during the etching process).

Referring to FIGS. 11 and 12, the upper portion 170 of the preliminary seed pattern 156, wherein the seed pattern 156 has the surface 162, is partially etched, forming a seed pattern 156*a* penetrating through the first insulating interlayer 152. The upper portion 170 of the preliminary seed pattern 156 may be partially removed through a wet etching process. Thus, the seed pattern 156*a* may have substantially no defects caused by an etching process. In one embodiment of the invention, the upper portion 170 of the preliminary seed pattern 156 is not completely etched away, so the seed pattern 156*a* includes an upper portion that protrudes from the bottom of the trench 160.

After the etching process for removing the surface 162 of the preliminary seed pattern 156 is performed, the upper portion 171 of the seed pattern 156*a* is tapered away from the substrate 150.

In one embodiment of the invention, a substantially greater amount of an etching solution may be provided onto upper side portions of the preliminary seed pattern 156 than is provided onto other portions of the preliminary seed pattern 156. Thus, the upper side portions of the preliminary seed pattern 156 may be etched more then (i.e., more intensively than) other portions of the preliminary seed pattern 156. As a result, the upper portion 171 of the seed pattern 156*a* may be tapered away from the substrate 150. That is, the width of a lower portion of upper portion 171 of seed pattern 156*a* may be substantially greater than the width of an upper portion of the upper portion 171 of the seed pattern 156*a*.

When the upper portion 171 of the seed pattern 156*a* may not substantially protrude from the first insulating interlayer 152 because an excessive etching process has been performed on the upper portion 170 of the preliminary seed pattern 156, wherein the upper portion 170 protruded from the preliminary seed pattern 156, the first insulating interlayer 152 may be partially etched so that the upper portion 171 of the seed pattern 156*a* will protrude from the first insulating interlayer 152.

Then, a stacked semiconductor device including a single crystalline structure is formed on the substrate 150 through processes that are substantially the same as the processes described with reference to FIGS. 8 through 10.

Hereinafter, a method of manufacturing a stacked semiconductor device in accordance with some embodiments of the invention will be described.

In some embodiments of the invention, a stacked semiconductor device may be formed on a substrate through processes that are substantially the same as the processes described with reference to FIGS. 3 through 10 except for a process for forming a seed pattern that has an upper portion that is tapered away from the substrate.

A first insulating interlayer, a preliminary seed pattern, and a second insulating interlayer may be formed on the substrate through processes that are substantially the same as those described with reference to FIGS. 3 through 5. A trench exposing an upper portion of the preliminary seed pattern may be formed by partially etching the second insulating interlayer and the first insulating interlayer. In one embodiment, the height of the top of the upper portion of the preliminary seed pattern, relative to the substrate, may be substantially greater than the height of the top of the preliminary seed pattern 106 shown in FIG. 5, relative to the substrate 100. When the upper portion of the preliminary seed pattern is partially etched through an isotropic etching process, a surface of the preliminary seed pattern that has been damaged by etching (i.e., a surface that has defects as a result of etching) may be removed to form a seed pattern penetrating through the first insulating interlayer.

A bias power that is substantially less than a bias power of a conventional anisotropic etching process may be applied to the substrate for the isotropic etching process for removing the surface of the preliminary seed pattern that has defects. For example, a bias power of about 50 W to about 100 W may be applied to the substrate while introducing an etching gas into a reaction chamber in which the substrate is loaded. The upper portion of the preliminary seed pattern may not be completely etched away, so the seed pattern may have an upper portion that protrudes from a bottom of a trench. The amount of etching gas that is provided onto upper side portions of the preliminary seed pattern may be substantially greater than the amount provided onto other portions of the preliminary seed pattern. Thus, the upper portion of the seed pattern may be formed such that the upper portion is tapered away from the substrate. That is, the width of an upper portion of the upper portion of the seed pattern may be substantially less than the width of a lower portion of the upper portion of the seed pattern. When the upper portion of the seed pattern does not protrude from the first insulating interlayer because an excessive etching process has been performed on the upper portion of the preliminary seed pattern, the first insulating interlayer may be partially etched to form a seed pattern having an upper portion that protrudes from the first insulating interlayer. The process for fabricating the stacked semiconductor device comprising a single crystalline silicon structure may be continued through processes that are substantially the same as the processes described with reference to FIGS. 8 through 10. However, the first and second insulating interlayers may be partially etched through a wet etching process prior to forming the first single crystalline silicon structure.

Figure 13:
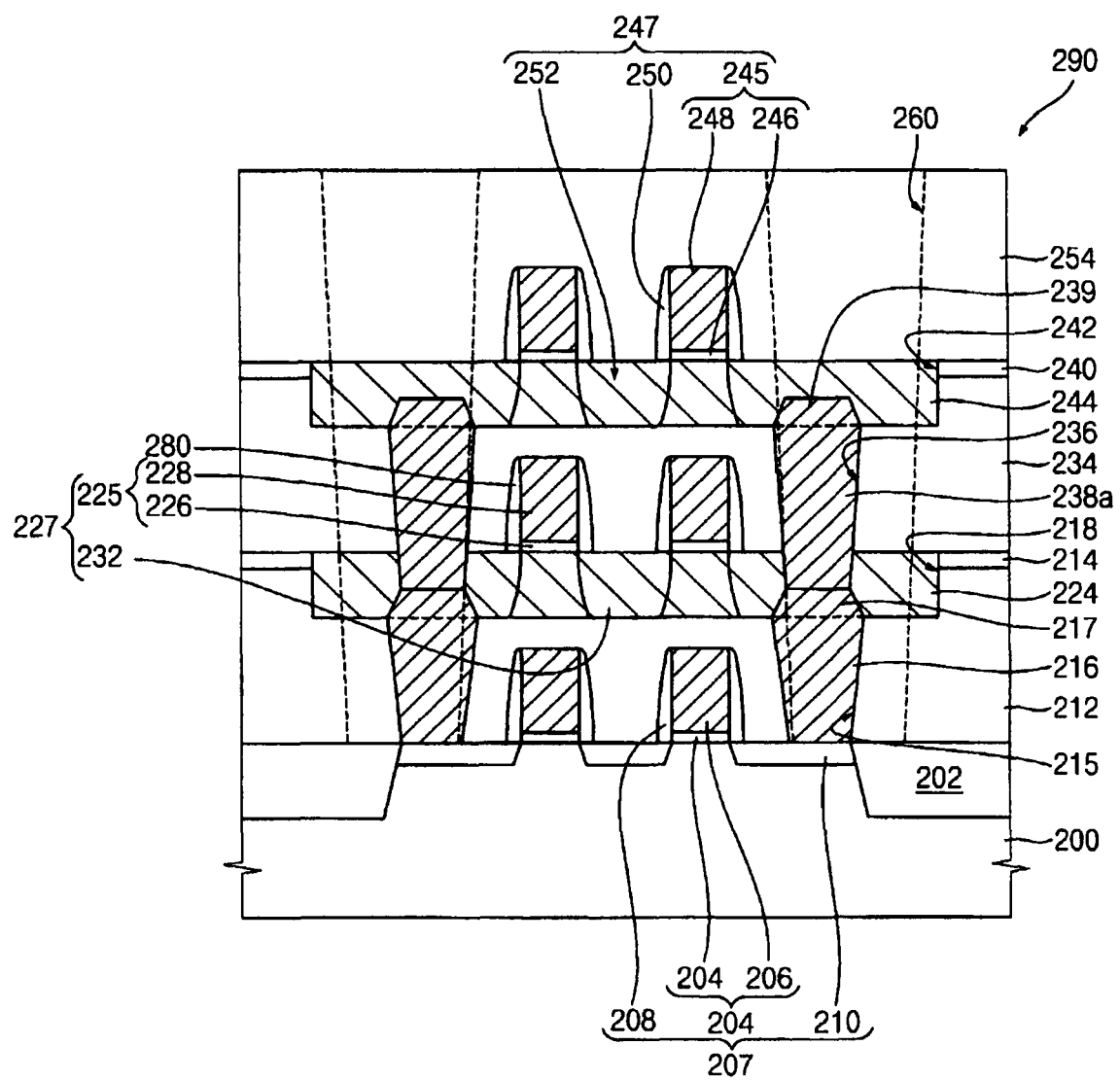
FIG. 13 is a cross-sectional view illustrating a stacked semiconductor device in accordance with yet another embodiment of the invention; and, FIGS. 14 to 16 are cross-sectional views illustrating a method of fabricating the stacked semiconductor device illustrated in FIG. 13.

FIG. 13 is a cross-sectional view illustrating a stacked semiconductor device in accordance with yet another embodiment of the invention. In FIG. 13, a stacked semiconductor device 290 corresponds to a portion of a full complementary metal oxide semiconductor (CMOS) device in a static random access memory (SRAM) device.

Referring to FIG. 13, the stacked semiconductor device 290 is formed on a substrate 200, in which an isolation layer 202 is formed. A surface of the substrate 200 may include single crystalline silicon, and a lower active region of the substrate 200 is defined by the isolation layer 202.

Lower n-type metal oxide semiconductor (NMOS) transistors 207 are formed on the lower active region of the substrate 200. The lower NMOS transistors 207 may serve as pull-down devices.

Each of the lower NMOS transistors 207 includes a gate structure 205 having a first gate oxide layer pattern 204 and a first conductive layer pattern 206; and first source/drain regions 210. The first source/drain regions 210 may be doped with n-type impurities.

A first spacer 208 is formed on a sidewall of the first conductive layer pattern 206. A nitride liner (not shown) may be formed on the substrate 200 to cover the first spacer 208 and the first conductive layer pattern 206.

A first insulating interlayer 212 is formed on the substrate 200 to cover the lower NMOS transistors 207. A first opening 215 is formed through the first insulating interlayer 212 to expose a portion of the substrate 200, and an upper portion of the first insulating interlayer 212 is recessed. The first opening 215 is disposed between the recessed upper portion of the first insulating interlayer 212 and the bottom of the first insulating interlayer 212. A first upper active region is formed in the recessed upper portion of the first insulating interlayer 212.

A first seed pattern 216 is formed on the substrate 200 and fills the first opening 215, and an upper portion 217 of the first seed pattern 216 protrudes from the first opening 215. The upper portion 217 of the first seed pattern 216 is tapered away from the substrate 200. That is, the width of a lower portion of the upper portion 217 of the first seed pattern 216 is substantially greater than the width of an upper portion of the upper portion 217 of the first seed pattern 216. The upper portion 217 of the first seed pattern 216 may be formed by removing a damaged surface of a preliminary first seed pattern from which the first seed pattern 216 is formed.

A second insulating interlayer 214 is formed on the first insulating interlayer 212, and a first trench 218 penetrates through the second insulating interlayer 214. Since the first trench 218 has the recessed upper portion of the first insulating interlayer 212, the first seed pattern 216 is exposed by the first trench 218.

A first single crystalline silicon structure 224 is formed on the first insulating interlayer 212 and fills the first trench 218. The first single crystalline silicon structure 224 includes a first single crystalline silicon layer pattern and a second single crystalline silicon layer pattern. The first single crystalline silicon layer pattern may be formed through an SEG process using the first seed pattern 216 as a seed, and the second single crystalline silicon layer pattern may be formed through thermally treating an amorphous silicon layer disposed adjacent to the first single crystalline silicon layer pattern. The first single crystalline silicon structure 224 may serve as the first upper active region.

P-type MOS (PMOS) transistors 227 are formed on the first upper active region, which is the first single crystalline silicon structure 224. The PMOS transistors 227 may serve as pull-up devices.

Each of the PMOS transistors 227 includes a second gate structure 225 comprising a second gate oxide layer pattern 226 and a second conductive layer pattern 228. Each of the PMOS transistors 227 further includes second source/drain regions 232. A second spacer 230 is selectively formed on a sidewall of the second conductive layer pattern 228.

Since at least one PMOS transistor 227 is formed on the first single crystalline silicon structure 224, the second source/drain regions 232 may be doped with p-type impurities.

A third insulating interlayer 234 is formed on the second insulating interlayer 214 and the first single crystalline silicon structure 224, and covers the PMOS transistors 227. A second opening 236 is formed through the third insulating interlayer 234 and the first single crystalline silicon structure 224 to expose the first seed pattern 216.

A second seed pattern 238a is formed on the first seed pattern 216 and fills the second opening 236. The second seed pattern 238a includes an upper portion 239 that protrudes from the third insulating interlayer 234 and is tapered away from the substrate 200. That is, the width of a lower portion of the upper portion 239 of the second seed pattern 238a may be substantially greater than the width of an upper portion of the upper portion 239 of the second seed pattern 238a. The upper portion 239 of the second seed pattern 238a may be formed by removing a damaged surface of a preliminary second seed pattern from which a second seed pattern 238a is formed. An upper portion of the third insulating interlayer 234 is recessed and exposes the upper portion 239 of the second seed pattern 238a.

A fourth insulating interlayer 240 is formed on the third insulating interlayer 234. A second trench 242 penetrates through the fourth insulating interlayer 240 and includes the recessed upper portion of the third insulating interlayer 234. In addition, the second seed pattern 238a is exposed through the second trench 242.

A second single crystalline silicon structure 244 is formed on the second seed pattern 238a and the third insulating interlayer 234, and fills the second trench 242. The second single crystalline silicon structure 244 may serve as a second upper active region. The second single crystalline silicon structure 244 includes a third single crystalline silicon layer pattern and a fourth single crystalline silicon layer pattern. The third single crystalline silicon layer pattern covers the second seed pattern 238a and the fourth single crystalline silicon layer pattern makes contact with the third single crystalline silicon layer pattern.

Upper NMOS transistors 247 are formed on the second single crystalline silicon structure 244. The upper NMOS transistors 247 may serve as access devices. In one embodiment of the invention, two upper NMOS transistors 247 may be formed on the second single crystalline silicon structure 244.

Each of the upper NMOS transistors 247 includes a third gate oxide layer pattern 246, a third conductive layer pattern 248, and third source/drain regions 252. A third spacer 250 is selectively formed on a sidewall of the third conductive layer pattern 248.

At least one upper NMOS transistor 247 is formed on the second single crystalline silicon structure 244, so the third source/drain regions 252 may be doped with n-type impurities.

A fifth insulating interlayer 254 is formed on the fourth insulating interlayer 240 and the second single crystalline silicon structure 244, and covers the upper NMOS transistors 247.

The stacked semiconductor device 290 further includes a contact plug 260 that extends from the fifth insulating interlayer 254 to the first insulating interlayer 212 and passes through the first and the fifth insulating interlayers 212 and 254. Hence, the contact plug 260 passes through the second and the first single crystalline silicon structures 244 and 224. The contact plug 260 makes contact with the lower active region of the substrate 200. Additionally, the contact plug 260 makes contact with the first source/drain regions 210, the second source/drain regions 232, and the third source/drain regions 252. Further, the contact plug 260 is electrically connected to the first conductive layer pattern 206, the second conductive layer pattern 228, and the third conductive layer pattern 248. That is, the contact plug 260 is electrically connected to the lower NMOS transistors 207, the PMOS transistors 227, and the upper NMOS transistors 247. Therefore, all of the transistors in the stacked semiconductor device 290 are electrically connected one another through the contact plug 260.

In accordance with embodiments of the invention, the PMOS transistors 227 disposed on the first single crystalline structure 224 and the upper NMOS transistors 247 disposed on the second single crystalline structure 244 may have improved electrical characteristics because the first and the second single crystalline silicon structures 224 and 244 may each have improved structures because they may each have fewer defects and voids relative to a single crystalline silicon layer of a conventional stacked semiconductor device. In addition, the first and the second single crystalline silicon structures 224 and 244 serving as channel layers are each sufficiently thick that the mobility of charge carriers through the first and the second single crystalline silicon structures 224 and 244 may be improved, thereby enhancing operation speeds of the PMOS transistors 272 and the upper NMOS transistors 247.

In some embodiments of the invention, the stacked semiconductor device 290 may further include a sixth insulating interlayer formed on the fifth insulating interlayer 254 and a third single crystalline silicon structure formed on the fifth insulating interlayer 254. Additionally, a third seed pattern may be formed through the fifth insulating interlayer 254.

In some embodiments of the invention, the stacked semiconductor device 290 may include, generally, a $(2N+1)^{th}$ insulating interlayer formed on a $2N^{th}$ insulating interlayer, and a $(2N+2)^{th}$ insulating interlayer formed on the $(2N+1)^{th}$ insulating interlayer, wherein N is a positive integer greater than 0. The $(2N+1)^{th}$ insulating interlayer may have a structure that is substantially the same as that of the first insulating interlayer 212, and the $(2N+2)^{th}$ insulating interlayer may have a structure that is substantially the same as that of the second insulating interlayer 214. The stacked semiconductor device 290 may further include an $(N+1)^{th}$ seed pattern formed through the $(2N+1)^{th}$ insulating interlayer, and an $(N+1)^{th}$ single crystalline silicon structure formed on the $(2N+1)^{th}$ insulating interlayer. In addition, the stacked semiconductor device 290 may include NMOS transistors formed on a $2N^{th}$ single crystalline silicon structure, and also PMOS transistors formed on a $(2N-1)^{th}$ single crystalline silicon structure.

Figure 14:
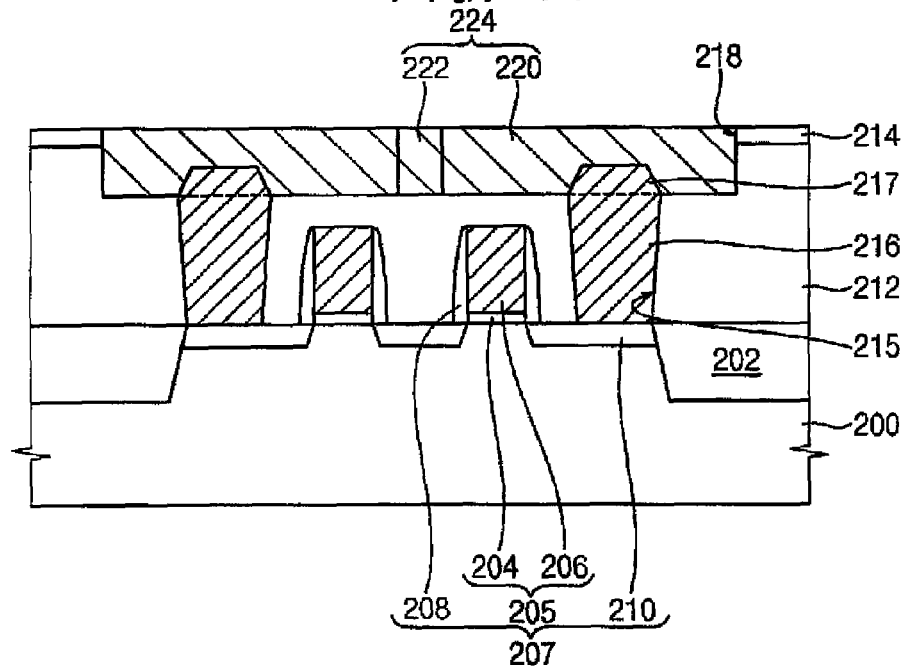
Figure 15:
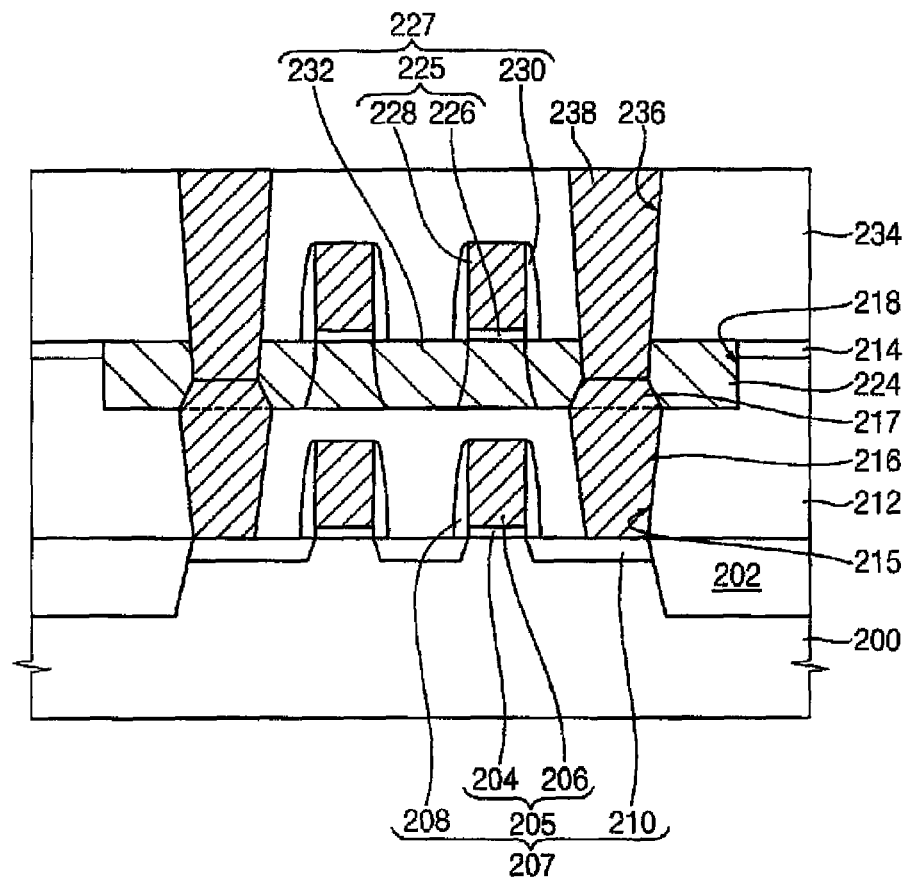
Figure 16:
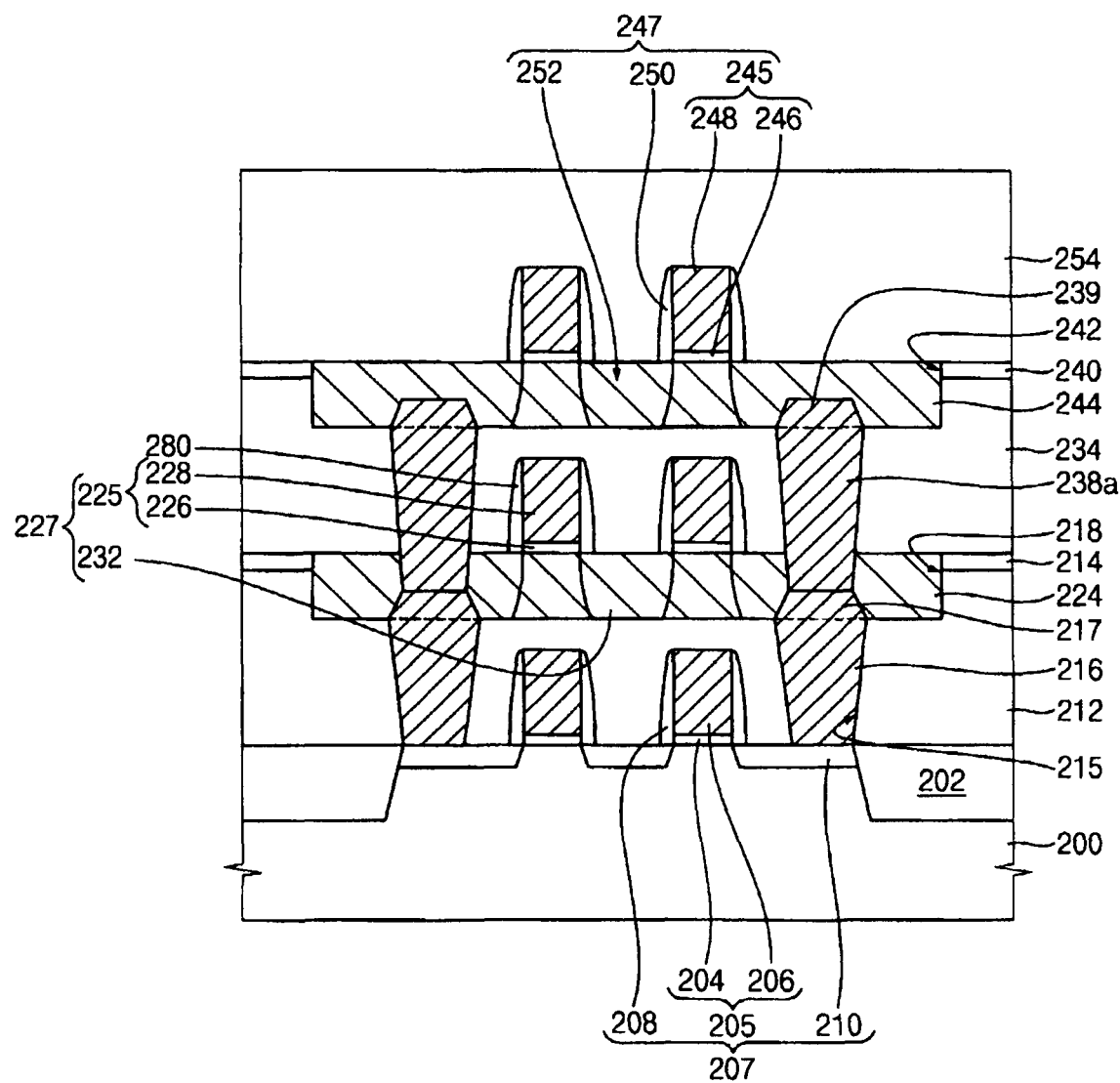

FIGS. 14 through 16 are cross-sectional views illustrating a method of fabricating the stacked semiconductor device 290 in accordance with an embodiment of the invention.

Referring to FIG. 14, the isolation layer 202 is formed in the substrate 200, and the substrate 200 has a surface that contains single crystalline silicon. The isolation layer 202 may be formed through a trench isolation process. The isolation layer 202 defines a lower active region of the substrate 200.

A first gate oxide layer and a first conductive layer are formed on the lower active region. The first conductive layer may be formed using doped polysilicon or metal. After a first hard mask layer (not shown) is formed on the first conductive layer, the first conductive layer and the first gate oxide layer are sequentially etched to form a first gate structure 205 on the lower active region. The first gate structure 205 includes the first gate oxide layer pattern 204 and the first conductive layer pattern 206.

The first spacer 208 is formed on a sidewall of the first gate structure 205. The first spacer 208 may be formed using nitride.

In an embodiment of the invention, a nitride liner may be formed on the substrate 200, the first spacer 208, and the first gate structure 205. The nitride liner may serve as an etch stop layer in subsequent etching processes.

Portions of the lower active region adjacent to the first gate structure are doped with n-type impurities to form the first source/drain regions 210. Thus, the lower NMOS transistor 207 serving as a pull-down device is formed on the lower active region of the substrate 200.

The first insulating interlayer 212 is formed on the substrate 200 to cover the lower NMOS transistor 207. The first insulating interlayer 212 is partially etched to form the first opening 215, which partially exposes the first source/drain regions 210.

The first seed pattern 216 is formed to fill first opening 215 through processes substantially the same as the processes described with reference to FIGS. 4 through 7. The first seed pattern 216 includes the upper portion 217 that protrudes from the first opening 215. The upper portion 217 of the first seed pattern 216 is tapered away from the substrate 200.

The second insulating interlayer 214 is formed on the first seed pattern 216 and the first insulating interlayer 212, and then the first trench 218 exposing the first seed pattern 216 is formed through processes that are substantially the same as the processes described with reference to FIGS. 5 through 7.

In one embodiment of the invention, the first seed pattern 216 and the second insulating interlayer 214, which the first trench 218 penetrates, may be formed through processes that are substantially the same as the processes described with reference to FIGS. 11 and 12.

The first single crystalline silicon structure 224 is formed on the first insulating interlayer 212 and the first seed pattern 216 to fill the first trench 218. The first single crystalline silicon 224 may be formed through processes that are substantially the same as the processes described with reference to FIGS. 8 through 10. The first single crystalline silicon structure 224 includes the first single crystalline silicon layer pattern 220 and the second single crystalline silicon layer pattern 222. The first single crystalline silicon layer pattern 220 may be formed through an SEG process. The second single crystalline silicon layer pattern 222 may be formed through a phase transition process that changes an amorphous silicon layer that makes contact with a first single crystalline silicon layer (from which the first single crystalline silicon layer pattern 220 is formed) into a second single crystalline silicon layer (from which the second single crystalline silicon layer pattern 222 is formed). Thus, the first single crystalline silicon structure 224 may have a sufficient thickness and the number of crystalline defects and voids in the first single crystalline silicon structure 224 may be reduced.

Referring to FIG. 15, a second gate oxide layer and a second conductive layer are formed on the first single crystalline silicon structure 224 and the second insulating interlayer 214. The second gate oxide layer and the second conductive layer are partially etched to form the second gate structure 225 on the first single crystalline silicon structure 224. The second gate structure 225 includes the second gate oxide layer pattern 226, and the second conductive layer pattern 228 sequentially formed on the first single crystalline silicon structure 224.

The second spacer 230 is selectively formed on a sidewall of the second gate structure 225. The second spacer 230 may be formed using a nitride such as silicon nitride.

Portions of the first single crystalline silicon structure 224 adjacent to the second gate structure 225 are doped with p-type impurities. Hence, the second source/drain regions 232 are formed in the first single crystalline silicon structure 224. As a result, the PMOS transistor 227 serving as a pull-up device is formed on the first single crystalline silicon structure 224.

Since the PMOS transistor 227 is formed on the first single crystalline silicon structure 224 having improved crystalline characteristics, the mobility of charge carriers in the PMOS transistor 227 may be enhanced.

The third insulating interlayer 234 is formed on the first single crystalline silicon structure 224 and on the second insulating interlayer 214 to cover the PMOS transistor 227. The third insulating interlayer 234 is partially etched to form the second opening 236 that exposes the upper portion 217 of the first seed pattern 216.

A preliminary second seed pattern 238 is formed on the first seed pattern 216 and formed to fill the second opening 236. The preliminary second seed pattern 238 may be formed in the second opening 236 through a process that is substantially the same as the process described with reference to FIG. 4.

Referring to FIG. 16, the second seed pattern 238a having the upper portion 239 is formed through processes that are substantially the same as the processes described with reference to FIGS. 5 through 7, and the second seed patterns 238a fills the second opening 236. The upper portion 239 of the second seed pattern 238a protrudes from the second opening 236 and is tapered away from the substrate 200.

The fourth insulating interlayer 240 is formed on the second seed pattern 238a and the third insulating interlayer 234. A second trench 242 exposing the second seed pattern 238a is formed by partially etching the fourth insulating interlayer 240 and the third insulating interlayer 234. The second insulating interlayer 240 and the second trench 242 may be formed by processes that are substantially the same as the processes described with reference to FIGS. 5 through 7.

The second single crystalline silicon structure 244 is formed in the second trench 242 to cover the second seed pattern 238a. The second single crystalline silicon structure 244 includes a third single crystalline silicon layer pattern and a fourth single crystalline silicon layer pattern. The third and fourth single crystalline silicon layer patterns may be formed through processes that are substantially the same as the processes for forming the first and the second single crystalline silicon layer patterns 220 and 222 (see FIG. 14). The second single crystalline silicon structure 244 may serve as a second upper active region.

A third gate oxide layer and a third conductive layer are formed on the second single crystalline silicon structure 244. The third gate oxide layer and the third conductive layer are partially etched to form the third gate structure 245 on the second single crystalline silicon structure 244. The third gate structure 245 includes the third gate oxide layer pattern 246 and the third conductive layer pattern 248.

The third spacer 250 is selectively formed on a sidewall of the third gate structure 245.

Portions of the second single crystalline silicon structure 244 adjacent to the third gate structure 245 are doped with n-type impurities to form the third source/drain regions 252. Thus, the upper NMOS transistor 247 is formed on the second single crystalline silicon structure 244.

The second single crystalline silicon structure 244 may have improved crystalline characteristics, so the mobility of charge carriers in the upper NMOS transistor 247 may be considerably enhanced.

The fifth insulating interlayer 254 is formed on the second single crystalline silicon 244 and the fourth insulating interlayer 240 to cover the upper NMOS transistor 247.

The fifth insulating interlayer 254, the second single crystalline silicon structure 244, the second seed pattern 238a, the third insulating interlayer 234, the first single crystalline silicon structure 224, the first seed pattern 216, and the first insulating interlayer 212 are etched, thereby forming a contact hole exposing a portion of the substrate 200. The first, the second, and the third source/drain regions 210, 232, and 252 are exposed through the contact hole. Additionally, the contact hole may expose a first conductive layer pattern 206 of an adjacent lower NMOS transistor 207 and a second conductive layer pattern 228 of an adjacent PMOS transistor 225.

A contact plug (not shown) is formed on the substrate 200 to fill the contact hole. The contact plug makes contact with the first seed pattern 216, the first single crystalline silicon structure 224, the second seed pattern 238a, and the second single crystalline silicon structure 244. Therefore, the first, the second, and the third source/drain regions 210, 232, and 252 are electrically connected to adjacent lower NMOS transistor 207, upper NMOS transistor 247, and PMOS transistor 227 through the contact plug. The contact plug may be formed using metal. In one embodiment of the invention, the contact plug may have a multi layer structure that includes a barrier metal layer pattern and a metal layer pattern.

The contact plug passes through the first and the second single crystalline silicon structures 224 and 244. Since the first and the second single crystalline silicon structures 224 and 244 serving as channel layers have sufficient thicknesses, contact areas between the contact plug and the first single crystalline silicon structure 224 and the contact plug and the second single crystalline silicon structure 244 may be relatively large compared to a conventional stacked semiconductor device. Therefore, a contact resistance in the stacked semiconductor device may be greatly reduced relative to a conventional stacked semiconductor device.

In some embodiments of the invention, a sixth insulating interlayer may be formed on the fifth insulating interlayer 254, and then a third single crystalline silicon structure may be formed on the fifth insulating interlayer. In addition, a third seed pattern may be formed through the fifth insulating interlayer 254.

Generally, a $(2N+1)^{th}$ (N is a positive integer greater than 0) insulating interlayer may be formed on a $2N^{th}$ insulating interlayer, and a $(2N+2)^{th}$ insulating interlayer may be formed on the $(2N+1)^{th}$ insulating interlayer. The $(2N+1)^{th}$ insulating interlayer may have a structure that is substantially the same as that of the first insulating interlayer 212, and the $(2N+2)^{th}$ insulating interlayer may have a structure that is substantially the same as that of the second insulating interlayer 214. In addition, an $(N+1)^{th}$ seed pattern may be formed through the $(2N+1)^{th}$ insulating interlayer. Additionally, an $(N+1)^{th}$ single crystalline silicon structure may be formed on the $(2N+1)^{th}$ insulating interlayer. Further, NMOS transistors may be formed on a $2N^{th}$ single crystalline silicon structure, and PMOS transistors may be formed on a $(2N-1)^{th}$ single crystalline silicon structure.

In accordance with embodiments of the invention, a stacked semiconductor device includes a single crystalline silicon structure that may have improved crystalline characteristics by reducing the number of crystalline defects and voids in the single crystalline silicon structure. Additionally, the single crystalline silicon structure, which serves as a channel layer, may have a sufficient thickness. Therefore, the stacked semiconductor device may have enhanced electrical characteristics and a high response speed.

Although embodiments of the invention have been described herein, those skilled in the art will readily appreciate that many modifications can be made to the embodiments described herein without departing from the scope of the invention as defined by the accompanying claims.

What is claimed is:

1. A stacked semiconductor device comprising:
   a first insulating interlayer comprising an opening that partially exposes a substrate, wherein the substrate comprises single crystalline silicon;
   a first seed pattern that fills the opening, wherein the first seed pattern comprises an upper portion disposed over the opening, and the upper portion is tapered away from the substrate;
   a second insulating interlayer formed on the first insulating interlayer, wherein a trench that exposes the upper portion of the first seed pattern penetrates the second insulating interlayer; and
   a first single crystalline silicon structure that fills the trench.

2. The stacked semiconductor device of claim 1, wherein the first single crystalline silicon structure comprises a first single crystalline layer pattern and a second single crystalline silicon layer pattern.

3. The stacked semiconductor device of claim 2, wherein the first single crystalline silicon layer pattern covers the first seed pattern and the second single crystalline silicon layer pattern makes contact with the first single crystalline silicon layer pattern.

4. The stacked semiconductor device of claim 2, further comprising a p-type metal oxide semiconductor (PMOS) transistor formed on the first single crystalline structure, wherein the PMOS transistor comprises a gate structure and source/drain regions.

5. The stacked semiconductor device of claim 4, further comprising a contact plug that makes contact with the source/drain regions of the PMOS transistor, wherein the contact plug passes through the first single crystalline silicon structure and the first seed pattern, and extends to the substrate.

6. The semiconductor device of claim 1, further comprising:
   a $(2N+1)^{th}$ insulating interlayer formed on a $2N^{th}$ insulating interlayer;
   a $(2N+2)^{th}$ insulating interlayer formed on the $(2N+1)^{th}$ insulating interlayer;
   an $(N+1)^{th}$ seed pattern formed through the $(2N+1)^{th}$ insulating interlayer; and
   an $(N+1)^{th}$ single crystalline silicon structure formed on the $(2N+1)^{th}$ insulating interlayer,
   wherein N is a positive integer greater than 0.

7. The semiconductor device of claim 6, wherein the structure of the $(2N+1)^{th}$ insulating interlayer is substantially the same as the structure of the first insulating interlayer, and the structure of the $(2N+2)^{th}$ insulating interlayer is substantially the same as the structure of the second insulating interlayer.

8. The semiconductor device of claim 6, further comprising:
   an n-type metal oxide semiconductor (NMOS) transistor formed on a $2N^{th}$ single crystalline silicon structure; and
   a p-type metal oxide semiconductor (PMOS) transistor formed a $(2N-1)^{th}$ single crystalline silicon structure.

9. The semiconductor device of claim 1, wherein the upper portion has a width substantially smaller than a width of the opening.

10. A semiconductor device comprising:
    a first insulating interlayer comprising an opening that partially exposes a substrate; and
    a first seed pattern that fills the opening, wherein the first seed pattern comprises an upper portion disposed over the opening, and the upper portion is tapered away from the substrate.

11. The semiconductor device of claim 10, further comprising a first silicon structure continuously formed from the first seed pattern, the first silicon structure formed on the first insulating interlayer.

12. A stacked semiconductor device comprising:
    at least three stacked structures, the stacked structure including
      a first insulating interlayer comprising an opening that partially exposes a substrate, wherein the substrate comprises single crystalline silicon;
      a first seed pattern that fills the opening, wherein the first seed pattern comprises an upper portion disposed over the opening, and the upper portion is tapered away from the substrate;
      a second insulating interlayer formed on the first insulating interlayer, wherein a trench that exposes the upper portion of the first seed pattern penetrates the second insulating interlayer; and
      a first single crystalline silicon structure that fills the trench.

* * * * *